(12) United States Patent
Sakakibara et al.

(10) Patent No.: US 6,872,474 B2
(45) Date of Patent: Mar. 29, 2005

(54) LIGHT EMITTING POLYMER COMPOSITION, AND ORGANIC ELECTROLUMINESCENCE DEVICE AND PRODUCTION PROCESS THEREOF

(75) Inventors: Mitsuhiko Sakakibara, Tokyo (JP); Hiroyuki Yasuda, Tokyo (JP); Yasunori Negoro, Kofu (JP)

(73) Assignee: JSR Corporation, Tokyo (JP)

( * ) Notice: Subject to any disclaimer, the term of this patent is extended or adjusted under 35 U.S.C. 154(b) by 62 days.

(21) Appl. No.: 10/290,370

(22) Filed: Nov. 8, 2002

(65) Prior Publication Data

US 2003/0116788 A1 Jun. 26, 2003

(30) Foreign Application Priority Data

Nov. 9, 2001 (JP) ........................................ 2001-344253
Nov. 9, 2001 (JP) ........................................ 2001-344254

(51) Int. Cl.$^7$ ........................ H01L 31/328; H05B 33/00
(52) U.S. Cl. ........................ 428/690; 428/917; 313/504; 313/506; 252/301.16; 257/200
(58) Field of Search ................................ 428/690, 917; 313/504, 506; 252/301.16; 257/200

(56) References Cited

U.S. PATENT DOCUMENTS

| | | | |
|---|---|---|---|
| 6,007,928 A | 12/1999 | Sakakibara et al. | ......... 428/690 |
| 6,310,231 B1 | 10/2001 | Igarashi et al. | ............. 556/489 |
| 6,451,458 B1 | 9/2002 | Sakakibara et al. | ......... 428/690 |
| 2001/0015432 A1 | 8/2001 | Igarashi et al. | ................. 257/1 |
| 2001/0019782 A1 | 9/2001 | Igarashi et al. | ............. 428/690 |

FOREIGN PATENT DOCUMENTS

| | | | |
|---|---|---|---|
| EP | 1 138 746 | | 10/2001 |
| EP | 1 245 659 | | 10/2002 |
| JP | 09-255725 | * | 9/1997 |
| JP | 2001-126875 | * | 5/2001 |

OTHER PUBLICATIONS

Jiang et al., Chemical Materials, (2000), vol. 12, pp. 2542–2549.*
Paik et al., Macromolecules, (2002), vol. 35, pp. 6782–6791.*
Hwang et al., Macromolecules, (2002), vol. 35, pp. 5438–5443.*
Meng et al., Journal of Physical Chemistry B, (1999), vol. 103, pp. 6429–6433.*
Song et al., Macromolecules, (1999), vol. 32, pp. 1482–1487.*

* cited by examiner

*Primary Examiner*—Dawn Garrett
(74) *Attorney, Agent, or Firm*—Oblon, Spivak, McClelland, Maier & Neustadt, P.C.

(57) ABSTRACT

Disclosed herein is a light emitting polymer composition which permits providing an organic electroluminescence device high in luminous efficiency and excellent in durability and forming a functional organic material layer with ease by the wet process.

7 Claims, No Drawings

LIGHT EMITTING POLYMER COMPOSITION, AND ORGANIC ELECTROLUMINESCENCE DEVICE AND PRODUCTION PROCESS THEREOF

BACKGROUND OF THE INVENTION

1. Field of the Invention

The present invention relates to a light emitting polymer composition suitably usable as an organic electroluminescence material, and an organic electroluminescence device and a production process thereof.

2. Description of the Background Art

An organic electroluminescence device is expected as a display device of the next generation because it has such excellent properties that it can be provided in a thin form, driven by direct current voltage, and is wide in angle of visibility, high in visibility and fast in the speed of response, and researches thereof are being actively conducted.

As organic electroluminescence devices, there have heretofore been known those of a single-layer structure that a light emitting layer composed of an organic material is formed between a positive electrode and a negative electrode and those of a multi-layer structure such as a structure having a hole transport layer between a positive electrode and a light emitting layer and a structure having an electron transport layer between a negative electrode and a light emitting layer. In all of these organic electroluminescence devices, light is emitted by recombining an electron injected from the negative electrode with a hole injected from the positive electrode at the light emitting layer.

As processes for forming functional organic material layers such as the light emitting layer and hole transport layer in such an organic electroluminescence device, there have been known a dry process that an organic material layer is formed by vacuum deposition and a wet process that a solution with an organic material dissolved therein is applied and dried to form a layer. Among these, the dry process is difficult to meet mass production because the process is complicated, and there is a limit to the formation of a large-area layer. On the other hand, the wet process can meet mass production because the process is relatively simple. In addition, a large-area functional organic material layer can be easily formed. In these respects, the wet process is useful compared with the dry process.

On the other hand, the functional organic material layer making up the organic electroluminescence device is required to have high durability and achieve high luminous efficiency. Those composed of various materials have heretofore been known, and functional organic material layers containing a phosphorescent organoiridium compound or organoosmium compound as a luminous molecule have recently been proposed (WO 00/70655). Such a functional organic material layer is formed of the organoiridium compound or organoosmium compound alone or of such a compound and a hole transport material such as 4,4'-N,N'-dicarbazole biphenyl or 4,4'-bis[N-(1-naphthyl)-N-phenylamino]biphenyl.

However, this functional organic layer is formed by the dry process, and so it is difficult to meet mass production and form a large-area functional organic material layer.

A light emitting material composed of an iridium compound, polyvinylcarbazole and oxadiazole has been proposed in MRS 2000 Fall Meeting (Nov. 27 to Dec. 1, 2000, Boston, Mass., USA).

However, this light emitting material involves a problem that it is poor in durability though it has high luminous efficiency.

SUMMARY OF THE INVENTION

The present invention has been made on the basis of the foregoing circumstances and has as its object the provision of a light emitting polymer composition which permits providing an organic electroluminescence device high in luminous efficiency and excellent in durability and forming a functional organic material layer with ease by the wet process.

Another object of the present invention is to provide an organic electroluminescence device high in luminous efficiency and excellent in durability, and a production process thereof.

According to the present invention, there is thus provided a light emitting polymer composition comprising a polymer component and a phosphorescent agent contained in the polymer component, wherein the polymer component is composed of a hole transporting component formed from 50 to 99 mol % of a hole transporting monomer and an electron transporting component formed from 50 to 1 mol % of an electron transporting monomer.

In the light emitting polymer composition, the polymer component may be a copolymer composed of 50 to 99 mol % of structural units derived from the hole transporting monomer and 50 to 1 mol % of structural units derived from the electron transporting monomer.

In the light emitting polymer composition, the polymer component may be composed of a hole transporting polymer obtained by polymerizing the hole transporting monomer and an electron transporting polymer obtained by polymerizing the electron transporting monomer, and a proportion of the hole transporting polymer to the electron transporting polymer may be 50:50 to 99:1 in terms of a molar ratio reduced to the monomers.

It may be preferable that the hole transporting monomer be an aromatic tertiary amine derivative, and the electron transporting monomer be an oxadiazole derivative.

Further, the phosphorescent agent may preferably be a complex compound of a metal selected from of iridium, platinum and osmium.

In particular, the phosphorescent agent may preferably be composed of an iridium complex compound represented by the following general formula (1):

General formula (1)

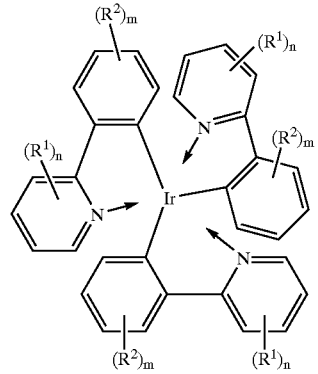

wherein $R^1$ and $R^2$ are, independently, a substituent composed of a fluorine atom, alkyl group or aryl group and may be the same or different from each other, m is an integer of 0 to 4, and n is an integer of 0 to 4.

The content of an impurity compound represented by the following general formula (X) in the phosphorescent agent may preferably be at most 1,000 ppm:

General formula (X)

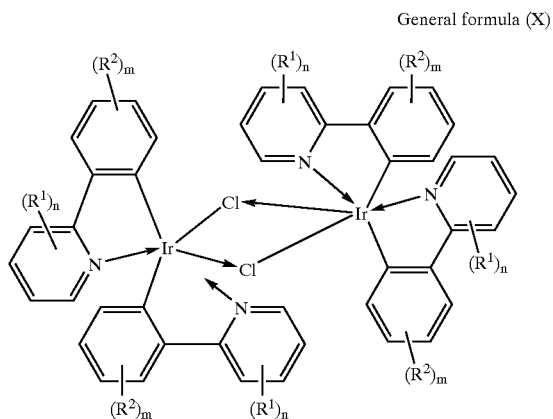

wherein $R^1$ and $R^2$ are, independently, a substituent composed of a fluorine atom, alkyl group or aryl group and may be the same or different from each other, m is an integer of 0 to 4, and n is an integer of 0 to 4.

According to the present invention, there is also provided an organic electroluminescence device comprising a functional organic material layer which functions as a light emitting layer or hole transport layer and is formed by a light emitting polymer composition comprising a polymer component and a phosphorescent agent contained in the polymer component, wherein the polymer component is composed of a hole transporting component formed from 50 to 99 mol % of a hole transporting monomer and an electron transporting component formed from 50 to 1 mol % of an electron transporting monomer.

According to the present invention, there is further provided a process for producing an organic electroluminescence device, which comprises the step of forming a functional organic material layer by applying a solution of a light emitting polymer composition comprising a polymer component and a phosphorescent agent contained in the polymer component, wherein the polymer component is composed of a hole transporting component formed from 50 to 99 mol % of a hole transporting monomer and an electron transporting component formed from 50 to 1 mol % of an electron transporting monomer dissolved in an organic solvent, to the surface of a substrate and subjecting the resultant coating to a treatment for removing the organic solvent.

DETAILED DESCRIPTION OF THE PREFERRED EMBODIMENTS

The embodiments of the present invention will hereinafter be described in details.

The light emitting polymer composition according to the present invention comprises component (A) composed of a polymer and a component (B) composed of a phosphorescent agent contained in the component (A). As the polymer composing the component (A) is used a polymer composed of a hole transporting component formed from 50 to 99 mol % of a hole transporting monomer and an electron transporting component formed from 50 to 1 mol % of an electron transporting monomer.

More specifically, the polymer composing the component (A) in the present invention is a copolymer (A-1) composed of structural units derived from the hole transporting monomer and structural units derived from the electron transporting monomer or a polymer mixture (A-2) comprising a hole transporting polymer formed by polymerizing the hole transporting monomer and an electron transporting polymer formed by polymerizing the electron transporting monomer.

The term "hole transporting polymer" as used in the present invention means a polymer having a function of injecting a hole from a positive electrode and transporting the hole or barriering an electron injected from a negative electrode when an electric field is applied. A monomer giving such a hole transporting polymer is referred to as "hole transporting monomer".

As examples of such a hole transporting monomer, may be mentioned polymerizable compounds having a structure that an electron donative group such as an amino group is bonded to a large conjugated skeleton such as benzene, naphthalene or biphenyl. In particular, aromatic tertiary amine compounds having a triphenylamine skeletal structure or carbazole skeletal structure are hole transporting monomers giving hole transporting polymers having excellent properties.

On the other hand, the term "electron transporting polymer" means a polymer having a function of injecting an electron from a negative electrode and transporting the electron or barriering a hole injected from a positive electrode when an electric field is applied. A monomer giving such an electron transporting polymer is referred to as "electron transporting monomer".

As examples of such an electron transporting monomer, may be mentioned oxadiazole derivatives, vasophenanthroline derivatives and triazole derivatives.

[Copolymer (A-1)]

The copolymer (A-1) is a copolymer of a hole transporting monomer and an electron transporting monomer. This copolymer may be any of a random copolymer, a block copolymer and an alternating copolymer obtained from the hole transporting monomer and the electron transporting monomer.

As the hole transporting monomer used for obtaining the copolymer (A-1), is preferably used an aromatic tertiary amine derivative, particularly, a carbazole derivative. Specific examples thereof include N-vinylcarbazole, 3,6-dimethyl-9-vinylcarbazole, 3,6-diethyl-9-vinylcarbazole, 3-methyl-9-vinylcarbazole and 3-ethyl-9-vinylcarbazole. Among these, N-vinylcarbazole and 3,6-dimethyl-9-vinylcarbazole are preferred.

As the electron transporting monomer used for obtaining the copolymer (A-1), is preferably used an oxadiazole derivative. Specific examples thereof include 2-β-naphthyl-5-(4-vinylphenyl)-1,3,4-oxadiazole, 2-α-naphthyl-5-(4-vinylphenyl)-1,3,4-oxadiazole, 2-phenyl-5-(4-vinylphenyl) oxadiazole, 2-phenyl-5-(4-vinyl-p-biphenyl)-1,3,4-oxadiazole, 2-(p-biphenyl)-5-(4-vinylphenyl)oxadiazole, 2-(p-biphenyl)-5-(4-propenylphenyl)-1,3,4-oxadiazole, 2-t-butoxyphenyl-5-(4-(4-vinylphenyl)-p-biphenyl)-1,3,4-oxadiazole, or substituted products of these oxadiazole derivatives with an acryloyl or methacryloyl group. Among these, 2-β-naphthyl-5-(4-vinyl-phenyl)-1,3,4-oxadiazole, 2-(p-biphenyl)-5-(4-vinylphenyl)-1,3,4-oxadiazole and 2-(p-biphenyl)-5-(4-propenylphenyl)-1,3,4-oxadiazole are preferred.

In the copolymer (A-1), a proportion of the structural units derived from the hole transporting monomer to the structural units derived from the electron transporting monomer is 50:50 to 99:1, preferably 65:35 to 95:5 in terms of a molar ratio. If the proportion of the structural units derived from the hole transporting monomer is too low, the amount of the hole injected is decreased. Therefore, such a copolymer is not preferred. If the proportion of the structural units derived from the hole transporting monomer is too high on the other hand, the amount of the hole injected is increased, and a balance with the electron upon recombination is destroyed. Therefore, such a copolymer is not preferred.

The copolymer (A-1) preferably has a weight average molecular weight of 2,000 to 1,500,000, particularly 5,000 to 500,000 in terms of polystyrene as measured by gel permeation chromatography. If the weight average molecular weight is lower than 2,000, the resulting light emitting polymer composition tends to become insufficient in heat resistance, stability and mechanical strength in a state of a thin film. If the weight average molecular weight exceeds 1,500,000 on the other hand, the resulting light emitting polymer composition tends to markedly increase its solution viscosity, and so the handling property thereof is lowered in the production of the organic electroluminescence device, and the stringing of its solution occurs. It is hence not preferable to use a copolymer having such too low or high molecular weight.

The total proportion of unreacted hole transporting monomer and electron transporting monomer contained in the copolymer (A-1) is preferably 5% by mass or lower.

The copolymer (A-1) is obtained by copolymerizing the hole transporting monomer and the electron transporting monomer in the presence of a cationic polymerization catalyst, radical polymerization catalyst or anionic polymerization catalyst in a proper solvent for polymerization.

As the solvent for polymerization, may be used a halogenated hydrocarbon such as methylene chloride or chlorobenzene, an aromatic hydrocarbon such as toluene or benzene, an ether solvent such as dibutyl ether, diphenyl ether, dioxane or tetrahydrofuran, or a high-polar solvent such as acetonitrile, nitrobenzene, N-methylpyrrolidone or dimethylacetamide.

As the cationic polymerization catalyst, may be used $HI—ZnI_2$, $I_2$, $I_2—HI$ or the like.

As the radical polymerization catalyst, may be used azobisisobutyronitrile, azobis-1-acetoxy-1-phenylethane or the like.

As the anionic polymerization catalyst, may be used alkyllithium or the like.

A proportion of the polymerization catalyst used is 0.0001 to 0.5 mol per mol of total of the hole transporting monomer and the electron transporting monomer.

The reaction temperature is, for example, −150 to 50° C. when the cationic polymerization catalyst is used, for example, 60 to 200° C. when the radical polymerization catalyst is used or, for example, 0 to 100° C. when the anionic polymerization catalyst is used.

[Polymer Mixture (A-2)]

The polymer mixture (A-2) is a mixture of a hole transporting polymer obtained by polymerizing the hole transporting monomer and an electron transporting polymer obtained by polymerizing the electron transporting monomer.

As specific examples of the hole transporting monomer used for obtaining the hole transporting polymer and the electron transporting monomer used for obtaining the electron transporting polymer, may be mentioned the same monomers as in the specific examples of the hole transporting monomer and the electron transporting monomer used for obtaining the copolymer (A-1) described above.

The hole transporting polymer making up the polymer mixture (A-2) preferably has a weight average molecular weight of 5,000 to 1,000,000, particularly 10,000 to 1,000,000 in terms of polystyrene as measured by gel permeation chromatography. If the weight average molecular weight is lower than 5,000, the resulting light emitting polymer composition tends to become insufficient in heat resistance, stability and mechanical strength in a state of a thin film. If the weight average molecular weight exceeds 1,000,000 on the other hand, the resulting light emitting polymer composition tends to markedly increase its solution viscosity, and so the handling property thereof is lowered in the production of the organic electroluminescence device, and the stringing of its solution occurs. It is hence not preferable to use a polymer having such too low or high molecular weight.

The electron transporting polymer making up the polymer mixture (A-2) preferably has a weight average molecular weight of 1,000 to 1,000,000 in terms of polystyrene as measured by gel permeation chromatography. If the weight average molecular weight is lower than 1,000, the resulting light emitting polymer composition tends to become insufficient in heat resistance, stability and mechanical strength. If the weight average molecular weight exceeds 1,000,000 on the other hand, the resulting light emitting polymer composition tends to markedly increase its solution viscosity, and so the handling property thereof is lowered in the production of the organic electroluminescence device, and the stringing of its solution occurs. It is hence not preferable to use a polymer having such too low or high molecular weight.

A proportion of the hole transporting polymer to the electron transporting polymer in the polymer mixture (A-2) is 50:50 to 99:1, preferably 70:30 to 99:1 in terms of a molar ratio reduced to the monomers. If the proportion of the hole transporting polymer is too low, the amount of the hole injected is decreased. Therefore, such a copolymer is not preferred. If the proportion of the hole transporting polymer is too high on the other hand, the amount of the hole injected is increased, and a balance with the electron upon recombination is destroyed. Therefore, such a copolymer is not preferred.

The hole transporting polymer and electron transporting polymer can be prepared by a cationic polymerization process, radical polymerization process or anionic polymerization process in a proper solvent for polymerization.

As the solvent for polymerization in the case where each polymer is prepared by the cationic polymerization process, may be used a halogenated hydrocarbon typified by methylene chloride or chlorobenzene, an ether solvent such as dibutyl ether, diphenyl ether, dioxane or tetrahydrofuran, or a high-polar solvent such as acetonitrile or nitrobenzene.

As a cationic polymerization catalyst, may be used a catalyst such as $HI—ZnI_2$, $I_2$ or $I_2—HI$. Besides, a catalyst composed of a combination of a Lewis acid and a base, such as a metal halide ether complex may also be used. A proportion of such a cationic polymerization catalyst used is 0.00001 to 0.01 mol per mol of N-vinylcarbazole polymerized first.

The reaction temperature is, for example, −150 to 50° C.

As the solvent for polymerization in the case where each polymer is prepared by the radical polymerization process, may be used an amide solvent such as dimethylformamide, dimethylacetamide or N-methylpyrrolidone, a hydrocarbon solvent such as benzene, toluene, xylene, hexane or cyclohexane, an ester such as γ-butyrolactone or ethyl lactate, or a ketone solvent such as cyclohexylbenzophenone or cyclohexanone.

As the radical polymerization catalyst, may be used a system composed of a peroxide and an N-oxy radical such as 4-methylsulfonyloxy-2,2',6,6'-tetramethyl-1-piperidine-N-oxide, 2,2',5,5'-tetramethylpyrrolizine oxide or 4-oxo-2,2',6,6'-tetramethyl-1-piperidine-N-oxide, or a sulfide catalyst. A proportion of such a radical polymerization catalyst used is 0.0001 to 0.5 mol per mol of the monomer.

The reaction temperature is, for example, 60 to 200° C.

As the solvent for polymerization in the case where each polymer is prepared by the anionic polymerization process, may be used an aromatic hydrocarbon such as toluene or benzene, an aliphatic hydrocarbon such as hexane or heptane, or an ether compound such as tetrahydrofuran.

As the anionic polymerization catalyst, may be used an alkali metal compound such as naphthalenepotassium or butyllithium, or an alkaline earth metal compound such as an ate-complex of barium and aluminum. Among these, butyllithium and naphthalenepotassium are preferred. A proportion of such an anionic polymerization catalyst used is 0.0001 to 0.1 mol per mol of the monomer.

The reaction temperature is, for example, 0 to 100° C.

[Component (B)]

The component (B) contained in the component (A) composed of the above-described polymer is a component composed of a phosphorescent agent. As the phosphorescent agent, is preferably used a complex compound of a metal selected from the group consisting of iridium, platinum and osmium, with an iridium complex compound being particularly preferred.

In the present invention, as the iridium complex compound, may be used a complex compound of iridium and a nitrogen-containing aromatic compound such as phenylpyridine, phenylpyrimidine, bipyridyl, 1-phenylpyrazole, 2-phenylquinoline, 2-phenylbenzothiazole, 2-phenyl-2-oxazoline, 2,4-diphenyl-1,3,4-oxadiazole, 5-phenyl-2-(4-pyridyl)-1,3-oxadiazole, 2-(2-pyridyl-thiophene)-2-phenyl-4H-3,1-benzoxazine-4 or a derivative thereof.

As specific examples of such an iridium complex compound, may be mentioned compounds represented by the following general formulae (1) to (3) and compounds represented by the following formulae (a) to (j):

General formula (1)

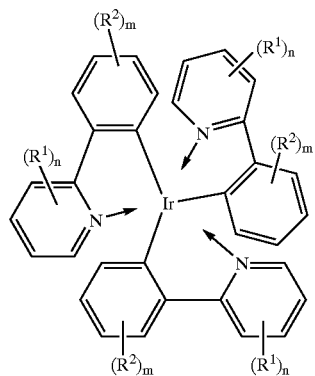

General formula (2)

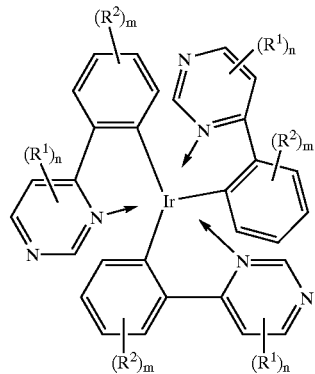

General formula (3)

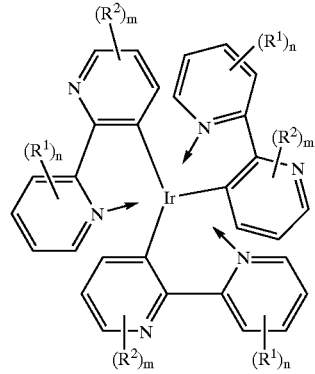

wherein $R^1$ and $R^2$ are, independently, a substituent composed of a fluorine atom, alkyl group or aryl group and may be the same or different from each other, m is an integer of 0 to 4, and n is an integer of 0 to 4 in the above-described general formulae (1) to (3).

In the above, specific examples of the alkyl group related to the substituent $R^1$ or $R^2$ include methyl, ethyl, isopropyl, t-butyl, n-butyl, isobutyl, hexyl and octyl groups.

Specific examples of the aryl group include phenyl, tolyl, xylyl, biphenyl and naphthyl groups.

Formula (a)

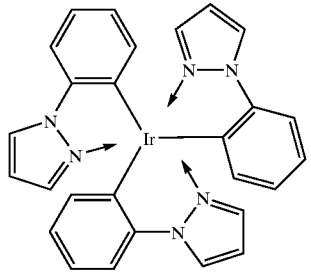

Formula (b)
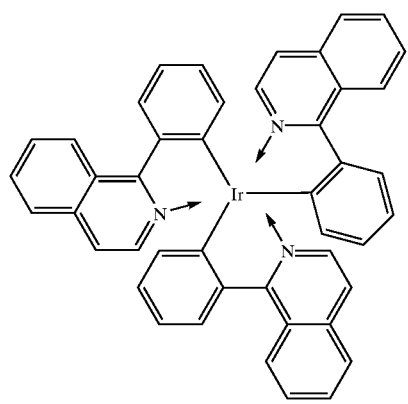
Formula (c)
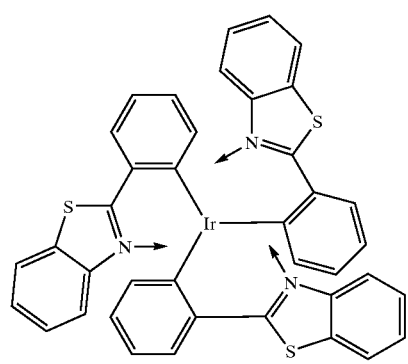
Formula (d)
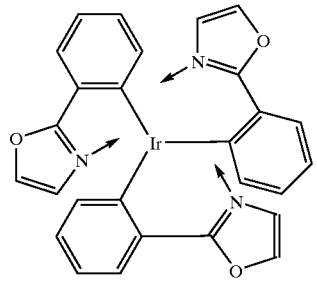
Formula (e)
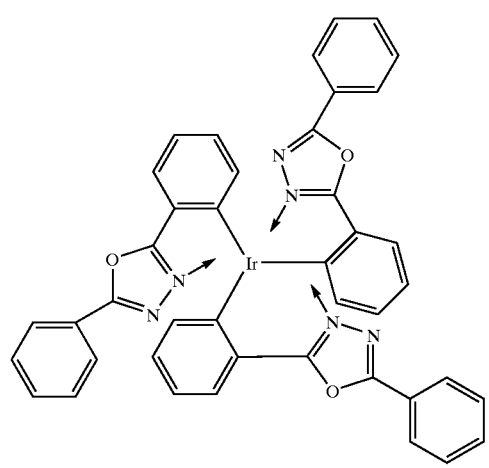
Formula (f)
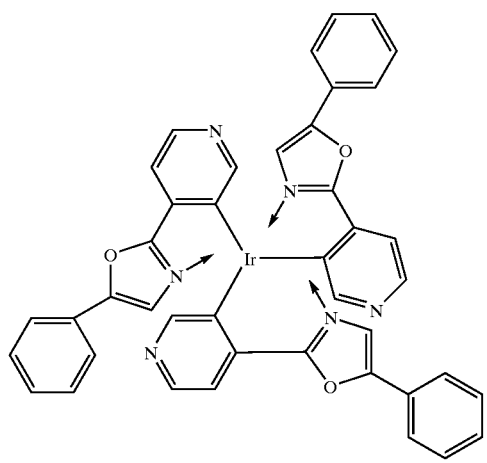
Formula (g)
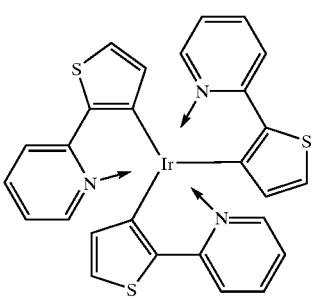
Formula (h)
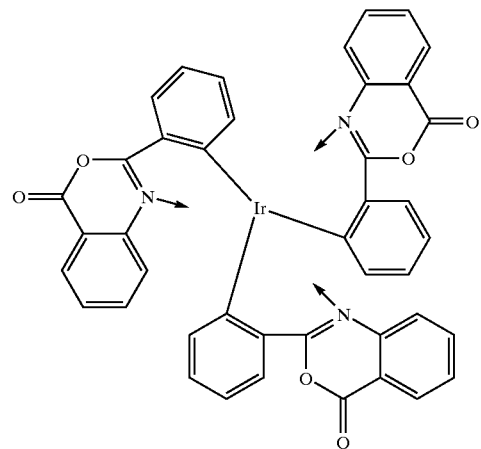
Formula (i)
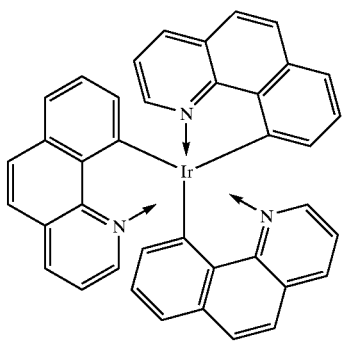

Formula (j)

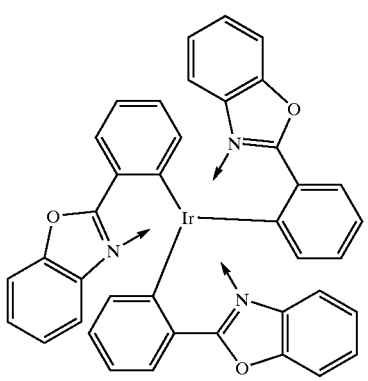

Among the above compounds, the iridium complex compound (hereinafter referred to as "specified iridium complex compound") represented by the general formula (1) is preferably used.

Specific examples of the specified iridium complex compound represented by the general formula (1) include a compound [tris(2,2-phenylpyridyl)iridium] represented by the following formula (k), a compound represented by the following formula (l) and a compound represented by the following formula (m):

Formula (k)

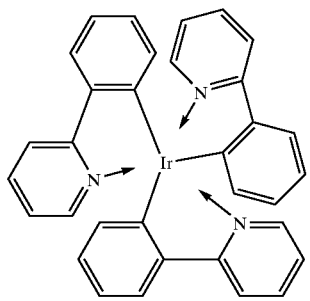

Formula (l)

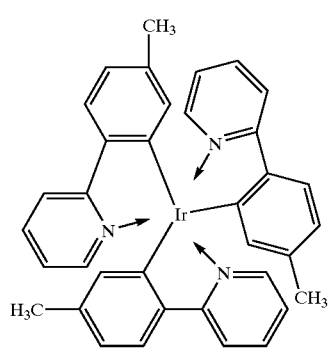

Formula (m)

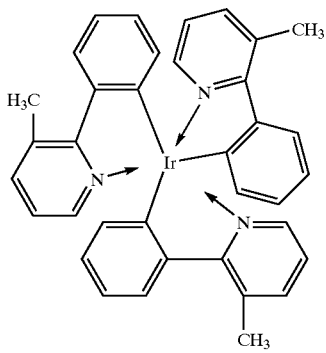

The specified iridium complex compound is generally synthesized by reacting a compound represented by the following general formula (A) with a compound represented by the following general formula (B) in the presence of a polar solvent. However, it is important that the content of a specified impurity compound represented by the following general formula (X), which is formed in this reaction, be at most 1,000 ppm.

General formula (A)

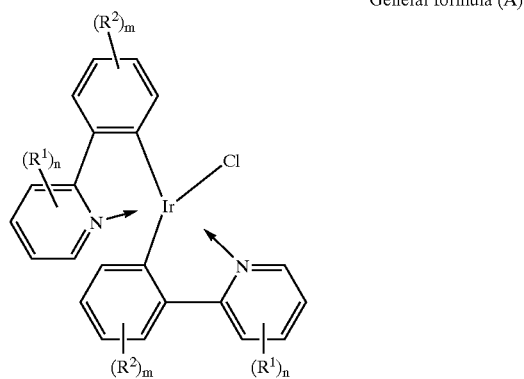

General formula (B)

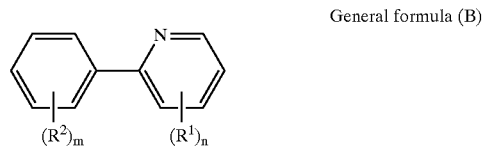

General formula (X)

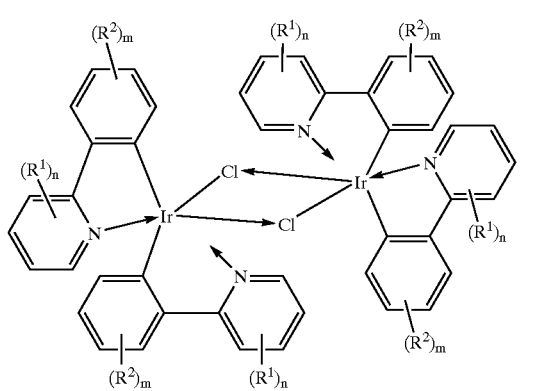

wherein $R^1$, $R^2$, m and n have the same meanings as defined in the general formula (1).

The specified iridium complex compound in which the content of the specified impurity compound is at most 1,000 ppm can be obtained by purifying the reaction product by the above-described synthesis reaction.

If the content of the specified impurity compound in the specified iridium complex compound exceeds 1,000 ppm, the light emitting performance that the specified iridium complex compound has is impaired, and so it is difficult to obtain an organic electroluminescence device high in both luminance and luminous efficiency.

The reaction of the compound represented by the above general formula (A) with the compound represented by the above general formula (B) for synthesizing the specified iridium complex compound is performed in the presence of a polar solvent.

As the polar solvent, one having a proper boiling point may be chosen for use from among glycerol, ethylene glycol derivatives and propylene glycol derivatives. Specific examples of the ethylene glycol derivatives include ethylene glycol monomethoxyether, ethylene glycol monoethoxyether and ethylene glycol monobutoxyether.

In this reaction, the reaction temperature is generally 150 to 300° C., and the reaction time is generally 1 to 24 hours.

A dimer of the compound represented by the general formula (1), i.e., the specified impurity compound represented by the above general formula (X) is generally contained in a proportion of, for example, about 1,000 to 100,000 ppm in the product by the above reaction. However, the content of the specified impurity compound can be reduced to at most 1,000 ppm by purifying this reaction product.

No particular limitation is imposed on the purification method. For example, solvent extraction, column chromatography, recrystallization or a combination thereof may be utilized.

According to the phosphorescent agent composed of the specified iridium complex compound thus obtained, the light emitting performance that the specified iridium complex compound has is sufficiently exhibited because the content of the specified impurity compound is extremely low, and consequently an organic electroluminescence device high in both luminance and luminous efficiency can be obtained.

As a specific preferable example of the specified iridium complex represented by the above general formula (2), may be mentioned a compound represented by the following formula (n):

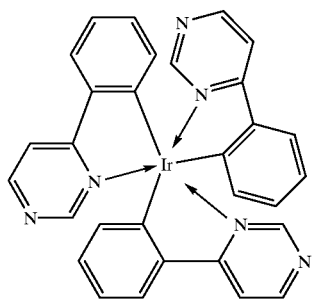

Formula (n)

Examples of the platinum complex compound used as the phosphorescent agent include platinum complexes of porphyrin and platinum complexes of phthalocyanine. As specific examples thereof, may be mentioned a platinum complex of octaethylporphyrin and a 2,3,7,8,12,13,17,18-octaethyl-21H,23H-platinum complex.

As the osmium complex compound, may be used various kinds of compounds commonly used as phosphorescent agents.

A proportion of the phosphorescent agent used is preferably 0.1 to 30 parts by mass, more preferably 0.5 to 10 parts by mass per 100 parts by mass of the polymer component. If this proportion is lower than 0.1 parts by mass, it may be difficult in some cases to achieve sufficient light emission. If the proportion exceeds 30 parts by mass on the other hand, a concentration quenching phenomenon that the brightness of light emission is rather reduced due to the excess proportion of the phosphorescent agent may occur in some cases. It is hence not preferable to use the phosphorescent agent in such a high proportion.

In the light emitting polymer composition according to the present invention, the above-described polymer component and phosphorescent agent are generally dissolved in a proper organic solvent, thereby providing it as a composition solution. This composition solution is applied to the surface of a substrate which will form a functional organic material layer, and the resultant coating is subjected to a treatment for removing the organic solvent, whereby a functional organic material layer of the polymer component composing a medium in which the phosphorescent agent is contained in an electroluminescence device can be formed.

The functional organic material layer thus obtained may be applied either as a light emitting layer or as a hole transport layer.

No particular limitation is imposed on the organic solvent used for preparing the composition solution so far as it can dissolve the polymer component and phosphorescent agent used therein. Specific examples thereof include halogenated hydrocarbons such as chloroform, chlorobenzene and tetrachloroethane, amide solvents such as dimethylformamide and N-methylpyrrolidone, ethyl lactate, propylene glycol methyl ether acetate, ethyl ethoxypropionate, and methyl amyl ketone. These organic solvents may be used either singly or in any combination thereof.

Among these, an organic solvent having a proper evaporation rate, specifically, an organic solvent having a boiling point of about 70 to 200° C. is preferably used in that a thin film having a uniform thickness can be obtained.

A proportion of the organic solvent used varies according to the kinds of the polymer component and phosphorescent agent used. However, it is generally such a proportion that the total concentration of the polymer component and phosphorescent agent in the resulting composition solution amounts to 0.1 to 10% by mass.

As a means for applying the composition solution, may be used, for example, a spin coating method, dipping method, roll coating method, ink-jet method or printing method.

No particular limitation is imposed on the thickness of the functional organic material layer formed, and it is generally selected within a range of 10 to 1,000 nm, preferably 30 to 200 nm.

According to such a light emitting polymer composition, an organic electroluminescence device high in luminous efficiency and excellent in durability can be provided. In addition, the functional organic material layer can be easily formed by the wet process.

The present invention will hereinafter be described specifically by the following examples. However, the present invention is not limited to these examples.

(1) Synthesis of Polymer:

SYNTHESIS EXAMPLE 1 (COPOLYMER)

A 1000-ml two-necked round-bottom flask was charged with 0.95 mol of N-vinylcarbazole, 0.05 mol of 2-biphenyl- 5-(p-vinylphenyl)-1,3,4-oxadiazole (hereinafter abbreviated as "V-PBD") and 0.02 mol of azobisisobutyronitrile under a nitrogen gas atmosphere, and dimethylformamide was further added in an amount 3 times of the mass of the monomers. Thereafter, the monomers were subjected to radical polymerization under conditions of 70° C. and 12 hours. The resultant reaction solution was poured into a great amount of methanol to solidify the reaction product. Reprecipitation purification was additionally repeated, whereby a proportion of unreacted monomers contained in the reaction product was reduced to at most 1% by mass.

The copolymer thus obtained was analyzed. As a result, it was identified that the copolymer was a copolymer composed of 94.8 mol % of structural units derived from N-vinylcarbazole and 5.2 mol % of structural units derived from V-PBD. The weight average molecular weight thereof was determined by the gel permeation chromatography and found to be 48,000 in terms of polystyrene. This copolymer will hereinafter be referred to as "Polymer (1)".

SYNTHESIS EXAMPLE 2 (COPOLYMER)

Radical polymerization was performed in the same manner as in Synthesis Example 1 except that the amounts of N-vinylcarbazole and V-PBD used in Synthesis Example 1 were changed to 0.8 mol and 0.2 mol, respectively, and the reaction product was subjected to reprecipitation purification.

The copolymer thus obtained was analyzed. As a result, it was identified that the copolymer was a copolymer composed of 79.5 mol % of structural units derived from N-vinylcarbazole and 20.5 mol % of structural units derived from V-PBD. The weight average molecular weight thereof was determined by the gel permeation chromatography and found to be 39,000 in terms of polystyrene. This copolymer will hereinafter be referred to as "Polymer (2)".

SYNTHESIS EXAMPLE 3 (COPOLYMER)

Radical polymerization was performed in the same manner as in Synthesis Example 1 except that the amounts of N-vinylcarbazole and V-PBD used in Synthesis Example 1 were changed to 0.5 mol and 0.5 mol, respectively, and the reaction product was subjected to reprecipitation purification.

The copolymer thus obtained was analyzed. As a result, it was identified that the copolymer was a copolymer composed of 50 mol % of structural units derived from N-vinylcarbazole and 50 mol % of structural units derived from V-PBD. The weight average molecular weight thereof was determined by the gel permeation chromatography and found to be 28,000 in terms of polystyrene. This copolymer will hereinafter be referred to as "Polymer (3)".

SYNTHESIS EXAMPLE 4 (HOLE TRANSPORTING POLYMER)

Radical polymerization was performed in the same manner as in Synthesis Example 1 except that the amount of N-vinylcarbazole used in Synthesis Example 1 was changed to 1.0 mol, and no V-PBD was used, and the reaction product was subjected to reprecipitation purification.

The molecular weight of the polymer thus obtained was 18,000. This polymer will hereinafter be referred to as "Polymer (4)".

SYNTHESIS EXAMPLE 5 (ELECTRON TRANSPORTING POLYMER)

Radical polymerization was performed in the same manner as in Synthesis Example 1 except that the amount of V-PBD used in Synthesis Example 1 was changed to 1.0 mol, and no N-vinylcarbazole was used, and the reaction product was subjected to reprecipitation purification.

The molecular weight of the polymer thus obtained was 35,000. This polymer will hereinafter be referred to as "Polymer (5)".

SYNTHESIS EXAMPLE 6 (COMPARATIVE COPOLYMER)

Radical polymerization was performed in the same manner as in Synthesis Example 1 except that the amounts of N-vinylcarbazole and V-PBD used in Synthesis Example 1 were changed to 0.4 mol and 0.6 mol, respectively, and the reaction product was subjected to reprecipitation purification.

The copolymer thus obtained was analyzed. As a result, it was identified that the copolymer was a copolymer composed of 39 mol % of structural units derived from N-vinylcarbazole and 61 mol % of structural units derived from V-PBD. The weight average molecular weight thereof was determined by the gel permeation chromatography and found to be 40,000 in terms of polystyrene. This copolymer will hereinafter be referred to as "Polymer (6)".

(2) Preparation of Phosphorescent Agent:

PREPARATION EXAMPLE (1)

A 200-ml three-necked flask equipped with a condenser and a thermometer was charged with 2 g of $\mu$-chlorobis(2-phenylpyridyl)iridium, 3 ml of 2-phenylpyridine and 160 ml of glycerol under a nitrogen atmosphere, and the contents were heated to 260° C. or higher to reflux them for 10 hours. The system was then cooled to 35° C., and the reaction solution was poured into 1 liter of water. After the resultant solution was filtered, the filtrate was extracted with methylene chloride and separated by column chromatography. After the solution separated was extracted with methylene chloride, and 100 ml of methanol were added to the extract, the resultant solution was concentrated by an evaporator, and the concentrated solution was cooled to 5° C. and recrystallized. As a result, yellow fibrous crystals were obtained. The yield thereof was 70%.

The fibrous crystals thus obtained were subjected to nuclear magnetic resonance spectrometric analysis, infrared spectrometric analysis, mass spectrometric analysis and elemental analysis. As a result, it was identified that this compound was an iridium complex compound containing tris(2,2-phenylpyridyl)iridium represented by the above formula (k) in a proportion of 99.9% by mass and containing a dimer of $\mu$-chlorobis(2-phenylpyridyl)iridium as an impurity compound in a proportion of 0.01% (100 ppm) or lower. This compound will hereinafter be referred to as "Phosphorescent Agent (1)".

EXAMPLE 1

Cyclohexane was added to 10 g of Polymer (1) obtained in Synthesis Example 1 and 0.5 g of Phosphorescent Agent (1) obtained in Preparation Example (1) in such a manner that the solid concentration amounts to 5% by mass, and the resultant mixture was stirred and filtered through a filter having a pore size of 2.52 $\mu$m, thereby preparing a composition solution with a light emitting polymer composition dissolved in the organic solvent. This composition solution will hereinafter be referred to as "Light Emitting Layer-Forming Coating Formulation (1)".

EXAMPLE 2

A composition solution was prepared in the same manner as in Example 1 except that 10 g of Polymer (2) obtained in Synthesis Example 2 were used in place of 10 g of Polymer (1) obtained in Synthesis Example 1. This composition solution will hereinafter be referred to as "Light Emitting Layer-Forming Coating Formulation (2)".

EXAMPLE 3

A composition solution was prepared in the same manner as in Example 1 except that 10 g of Polymer (3) obtained in Synthesis Example 3 were used in place of 10 g of Polymer (1) obtained in Synthesis Example 1. This composition solution will hereinafter be referred to as "Light Emitting Layer-Forming Coating Formulation (3)".

EXAMPLE 4

A composition solution was prepared in the same manner as in Example 1 except that 10 g of a polymer mixture with Polymer (4) obtained in Synthesis Example 4 and Polymer (5) obtained in Synthesis Example 5 mixed in a proportion that a molar ratio of the monomers related to the respective polymers amounted to 9:1 were used in place of 10 g of Polymer (1) obtained in Synthesis Example 1. This composition solution will hereinafter be referred to as "Light Emitting Layer-Forming Coating Formulation (4)".

COMPARATIVE EXAMPLE 1

A composition solution was prepared in the same manner as in Example 1 except that 10 g of Polymer (4) obtained in Synthesis Example 4 were used in place of 10 g of Polymer (1) obtained in Synthesis Example 1. This composition solution will hereinafter be referred to as "Light Emitting Layer-Forming Coating Formulation (5)".

COMPARATIVE EXAMPLE 2

A composition solution was prepared in the same manner as in Example 1 except that 10 g of Polymer (6) obtained in Synthesis Example 6 were used in place of 10 g of Polymer (1) obtained in Synthesis Example 1. This composition solution will hereinafter be referred to as "Light Emitting Layer-Forming Coating Formulation (6)".

TEST EXAMPLE
(a) Production of Organic Electroluminescence Device:

A solution with an aromatic polymer (trade name: PEDOT P8000, product of Bayer AG) dissolved in a proportion of 5% by mass was applied to the surface of a glass substrate of 5-cm square, on which an ITO film had been formed, and the coating layer thus formed was subjected to a heat treatment at 250° C. for 30 minutes, thereby forming an aromatic polymer layer.

Light Emitting Layer-Forming Coating Formulation (1) was then applied on the surface of the aromatic polymer layer by a spin coater to form a coating layer having a thickness of 70 nm. This coating layer was subjected to a heat treatment at 200° C. for 30 minutes, thereby forming a light emitting layer composed of the light emitting polymer composition.

Vasophenanthroline and Cs were vapor-deposited on the surface of the light emitting layer thus obtained so as to give a molar ratio of 3:1. An aluminum film having a thickness of 1,500 Å was then formed on the surface of the deposited film thus obtained, thereby producing an organic electroluminescence device. This device will be referred to as "Organic EL Device (1)".

Organic electroluminescence devices were produced in the same manner as described above except that Light Emitting Layer-Forming Coating Formulations (2) to (6) were respectively used in place of Light Emitting Layer-Forming Coating Formulation (1). They will be referred to as "Organic EL Device (2)" for Forming Coating Formulation (2), "Organic EL Device (3)" for Forming Coating Formulation (3), "Organic EL Device (4)" for Forming Coating Formulation (4), "Organic EL Device (5)" for Forming Coating Formulation (5), "Organic EL Device (6)" for Forming Coating Formulation (6).

(b) Light Emission Properties:

To each of Organic EL Devices (1) to (6) produced in the item (a), was applied direct current voltage of 25 V using the ITO film as an anode and the aluminum film as a cathode, thereby causing the light emitting layer to emit light to measure the emission starting voltage, maximum luminance, energy efficiency and luminous efficiency.

(c) Durability:

Each light emitting layer in Organic EL Devices (1) to (6) produced in the item (a) was caused to emit light under conditions that the voltage applied was kept constant at 20 V, thereby measuring a period of time (half-life) from the beginning of the light emission to the time the luminance becomes a half of the initial luminance to find an index (hereinafter referred to as "half-life index") when the half-life value of Organic EL Devices (6) was regarded as 100.

The results are shown in Table 1. In Table 1, "Ratio H/E of polymer components" expresses a molar ratio of the hole transporting component to the electron transporting component in the polymer component reduced to the monomers.

TABLE 1

|  | Light emitting layer-forming coating formulation | Ratio H/E of polymer components | Emission starting voltage (V) | Maximum Luminance (cd) | Energy efficiency (lm/W) | Luminous efficiency (cd/A) | Half-life index |
|---|---|---|---|---|---|---|---|
| Example |  |  |  |  |  |  |  |
| 1 | (1) | 94.8/5.2 | 8 | 15000 | 2 | 12 | 800 |
| 2 | (2) | 79.5/20.5 | 5 | 50000 | 5 | 20 | 2000 |
| 3 | (3) | 50/50 | 4 | 15000 | 3 | 13 | 8000 |
| 4 | (4) | 90/10 | 4.5 | 40000 | 4 | 17 | 2000 |
| Comparative Example |  |  |  |  |  |  |  |
| 1 | (5) | 100/0 | 10 | 3500 | 0.8 | 4 | 110 |
| 2 | (6) | 40/60 | 4 | 8000 | 1.5 | 0.8 | 100 |

According to the present invention, there can be provided light emitting polymer compositions which permits providing an organic electroluminescence device high in luminous efficiency and excellent in durability and forming a functional organic material layer with ease by the wet process.

What is claimed is:

1. A light emitting polymer composition comprising a polymer component and a phosphorescent agent contained in the polymer component, wherein the polymer component is a copolymer composed of 50 to 99 mol % of structural units derived from the hole transporting monomer and 50 to 1 mol % of structural units derived from the electron transporting monomer, in which the electron transporting monomer is an oxadiazole derivative selected from the group consisting of 2-β-naphthyl-5-(4-vinylphenyl)-1,3,4-oxadiazole, 2-α-naphthyl-5-(4-vinylphenyl)-1,3,4-oxadiazole, 2-phenyl-5-(4-vinylphenyl)-1,3,4-oxadiazole, 2-phenyl-5-(4-vinyl-p-biphenyl)-1,3,4-oxadiazole, 2-(p-biphenyl)-5-(4-vinylphenyl)-1,3,4-oxadiazole, 2-(p-biphenyl)-5-(4-propenylphenyl)-1,3,4-oxadiazole, 2-t-butoxyphenyl-5-(4-(4-vinylphenyl)-p-biphenyl)-1,3,4-oxadiazole, and substituted products of these oxadiazole derivatives with an acryloyl or methacryloyl group.

2. The light emitting polymer composition according to claim 1, wherein the hole transporting monomer is an aromatic tertiary amine derivative.

3. The light emitting polymer composition according to claim 1 or 2, wherein the phosphorescent agent is a complex compound of a metal selected from the group consisting of iridium, platinum, osmium, and combinations thereof.

4. The light emitting polymer composition according to claim 1 or 2, wherein the phosphorescent agent comprises an iridium complex compound represented by formula (1):

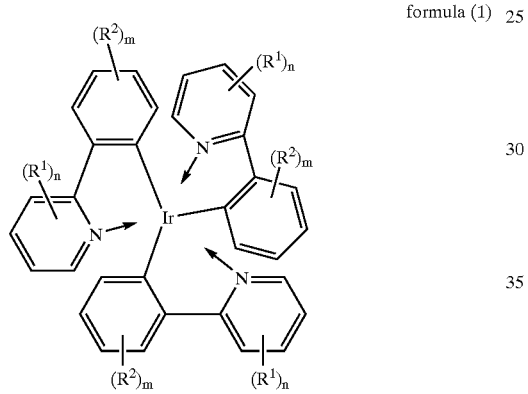

formula (1)

wherein $R^1$ and $R^2$ are, independently, a substituent composed of a fluorine atom, alkyl group or aryl group and may be the same or different from each other, m is an integer of 0 to 4, and n is an integer of 0to 4.

5. The light emitting polymer composition according to claim 4, wherein the content of an impurity compound represented by formula (X) in the phosphorescent agent is at most 1,000 ppm:

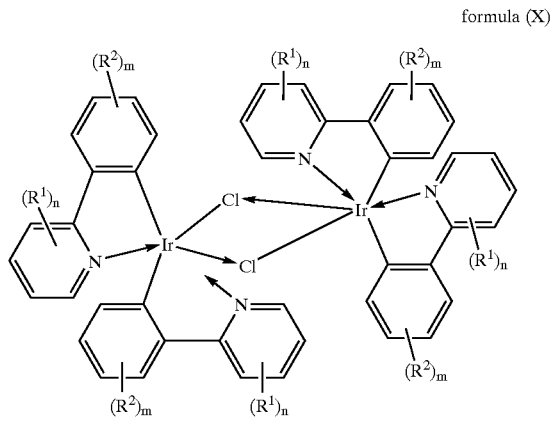

formula (X)

wherein $R^1$ and $R^2$ are, independently, a substituent composed of a fluorine atom, alkyl group or aryl group and may be the same or different from each other, m is an integer of 0 to 4, and n is an integer of 0 to 4.

6. An organic electroluminescence device, comprising:
a functional organic material layer which functions as a light emitting layer or hole transport layer and is formed by a light emitting polymer composition comprising a polymer component and a phosphorescent agent contained in the polymer component, wherein the polymer component is a copolymer composed of 50 to 99 mol % of structural units derived from the hole transporting monomer and 50 to 1 mol % of structural units derived from the electron transporting monomer, in which the electron transporting monomer is an oxadiazole derivative selected from the group consisting of 2-β-naphthyl-5-(4-vinylphenyl)-1,3,4-oxadiazole, 2-α-naphthyl-5-(4-vinylphenyl)-1,3,4-oxadiazole, 2-phenyl-5-(4-vinylphenyl)-1,3,4-oxadiazole, 2-phenyl-5-(vinyl-p-biphenyl)-1,3,4-oxadiazole, 2-(p-biphenyl)-5-(4-vinylphenyl)-1,3,4-oxadiazole, 2-(p-biphenyl)-5-(4-propenylphenyl)-1,3,4-oxadiazole, 2-t-butoxyphenyl-5-(4-(4-vinylphenyl)-p-biphenyl)-1,3,4-oxadiazole, and substituted products of these oxadiazole derivatives with an acryloyl or methacryloyl group.

7. A process for producing an organic electroluminescence device, which comprises the step of forming a functional organic material layer by applying a solution of a light emitting polymer composition dissolved in an organic solvent, to the surface of a substrate and subjecting the resultant coating to a treatment for removing the organic solvent, in which the light emitting polymer composition comprises a polymer component and a phosphorescent agent contained in the polymer component, wherein the polymer component is a copolymer composed of 50 to 99 mol % of structural units derived from the hole transporting monomer and 50 to 1 mol % of structural units derived from the electron transporting monomer, in which the electron transporting monomer is an oxadiazole derivative selected form a group consisting of 2-β-naphthyl-5-(4-vinylphenyl)-1,3,4-oxadiazole, 2-α-naphthyl-5-(4-vinylphenyl)-1,3,4-oxadiazole, 2-phenyl-5-(4-vinylphenyl)-1,3,4-oxadiazole, 2-phenyl-5-(vinyl-p-biphenyl)-1,3,4-oxadiazole, 2-(p-biphenyl)-5-(4-vinylphenyl)-1,3,4-oxadiazole, 2-(p-biphenyl)-5-(4-propenylphenyl)-1,3,4-oxadiazole, 2-t-butoxyphenyl-5-(4-(4-vinylphenyl)-p-biphenyl)-1,3,4-oxadiazole, and substituted products of these oxadiazole derivatives with an acryloyl or methacryloyl group.

* * * * *